United States Patent
Odnoblyudov et al.

(10) Patent No.: US 9,756,697 B2
(45) Date of Patent: *Sep. 5, 2017

(54) MONOLITHIC LED CHIP IN AN INTEGRATED CONTROL MODULE WITH ACTIVE CIRCUITRY

(71) Applicant: Bridgelux, Inc., Livermore, CA (US)

(72) Inventors: Vladimir Odnoblyudov, Danivlle, CA (US); Jesus Del Castillo, Palo Alto, CA (US)

(73) Assignee: Bridgelux, Inc., Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/186,343

(22) Filed: Jun. 17, 2016

(65) Prior Publication Data

US 2016/0302283 A1    Oct. 13, 2016

Related U.S. Application Data

(63) Continuation of application No. 15/008,358, filed on Jan. 27, 2016, now Pat. No. 9,392,666, which is a
(Continued)

(51) Int. Cl.
*H05B 33/08* (2006.01)
*H01L 25/075* (2006.01)
(Continued)

(52) U.S. Cl.
CPC ..... *H05B 33/0869* (2013.01); *H01L 25/0753* (2013.01); *H01L 25/167* (2013.01);
(Continued)

(58) Field of Classification Search
CPC ... H01L 25/0753; H01L 25/167; H01L 33/32; H01L 33/50; H01L 33/504; H01L 33/507;
(Continued)

(56) References Cited

U.S. PATENT DOCUMENTS 8,274,644 B2    9/2012  Nisper et al. ............. 356/45
8,371,717 B2    2/2013  Lai ........................... 362/276
(Continued)

OTHER PUBLICATIONS

Image of ProLight Opto Driver on Board from ProLight Opto Technology Corporation downloaded from Internet on Oct. 24, 2013 from site http://www.led-professional.com/products/led-modules-led-light-engines/prolight-opto-launches-new-driver-on-board-dob-series.
(Continued)

*Primary Examiner* — Armando Rodriguez
(74) *Attorney, Agent, or Firm* — Imperium Patent Works; Darien K. Wallace

(57) ABSTRACT

A lighting device includes a monolithic LED chip flip-chip mounted onto an interconnect structure. The monolithic chip includes LED junctions formed from a single LED junction. An active electronic component is also mounted onto the interconnect structure at a distance from the monolithic chip that is less than five times the maximum dimension of the monolithic chip. The active electronic component controls LED drive currents independently supplied to the LED junctions. Different types of phosphor are disposed laterally above the various LED junctions. A color sensor measures the light emitted from the lighting device when drive currents are supplied to first and second LED junctions. The active electronic component then supplies more drive current to the first LED junction than to the second LED junction in response to the color sensor measuring the light emitted when the prior LED drive currents are supplied to the first and second LED junctions.

19 Claims, 14 Drawing Sheets

ONE WAY TO DRIVE MULTIPLE STRINGS OF LED JUNCTIONS WITH MULTIPLE BUCK CONVERTERS

Related U.S. Application Data continuation of application No. 14/318,383, filed on Jun. 27, 2014, now Pat. No. 9,277,618.

(51) Int. Cl.
| | |
|---|---|
| *H01L 33/62* | (2010.01) |
| *H01L 25/16* | (2006.01) |
| *H01L 33/50* | (2010.01) |
| *H01L 33/56* | (2010.01) |
| *H01L 33/32* | (2010.01) |
| *H05B 37/02* | (2006.01) |

(52) U.S. Cl.
CPC .............. *H01L 33/32* (2013.01); *H01L 33/50* (2013.01); *H01L 33/504* (2013.01); *H01L 33/507* (2013.01); *H01L 33/56* (2013.01); *H01L 33/62* (2013.01); *H05B 33/083* (2013.01); *H05B 33/0812* (2013.01); *H05B 33/0815* (2013.01); *H05B 33/0827* (2013.01); *H05B 37/0227* (2013.01); *H01L 2924/0002* (2013.01)

(58) Field of Classification Search
CPC ..... H01L 33/56; H01L 33/62; H05B 33/0869; H05B 33/0812; H05B 33/0815; H05B 33/0827; H05B 33/083; H05B 37/0227
See application file for complete search history.

(56) References Cited

U.S. PATENT DOCUMENTS

| | | | |
|---|---|---|---|
| 8,536,584 B2 | 9/2013 | Yao | 257/79 |
| 8,642,363 B2 | 2/2014 | Lau et al. | 438/28 |
| 9,277,618 B2* | 3/2016 | Odnoblyudov | H05B 33/0869 |
| 2008/0103714 A1* | 5/2008 | Aldrich | G01J 3/46 |
| | | | 702/81 |
| 2011/0199203 A1 | 8/2011 | Hsu | 340/449 |
| 2012/0032612 A1 | 2/2012 | Antony et al. | 315/297 |
| 2012/0062150 A1 | 3/2012 | West | 315/309 |
| 2012/0256548 A1 | 10/2012 | Collins et al. | 315/151 |
| 2013/0084748 A1 | 4/2013 | Zaderej et al. | 439/620.02 |
| 2013/0176732 A1 | 7/2013 | McGowan et al. | 362/249.02 |
| 2015/0002023 A1* | 1/2015 | Imangholi | G01K 7/00 |
| | | | 315/129 |

OTHER PUBLICATIONS

Datasheet for Molex part 180414-0102, Molex Incorporated, downloaded from Internet on Oct. 24, 2013 from http://www.molex.com/webdocs/datasheets/pdf/en-us/1804140102_SOLID_STATE_LIGHTI.pdf.

* cited by examiner

CROSS-SECTIONAL VIEW TAKEN ALONG LINE A-A'
(SHOWN ON A HEAT SINK)

CROSS-SECTIONAL VIEW TAKEN ALONG LINE B-B'
(SHOWN ON A HEAT SINK)

CROSS-SECTIONAL VIEW TAKEN ALONG LINE C-C'
(SHOWN ON A HEAT SINK)

SCHEMATIC OF THE INTEGRATED CONTROL MODULE

DIAGRAM OF THE ICM WITH AN
INTEGRATED BUCK CONVERTER

ONE WAY TO DRIVE MULTIPLE STRINGS OF LED JUNCTIONS WITH MULTIPLE BUCK CONVERTERS

ANOTHER WAY TO DRIVE MULTIPLE STRINGS OF LED JUNCTINS WITH MULTIPLE BUCK CONVERTERS

LIGHTING SYSTEM INVOLVING MULTIPLE 48V
INTEGRATED CONTROL MODULES OF FIG. 13

MONOLITHIC LED CHIP IN AN INTEGRATED CONTROL MODULE WITH ACTIVE CIRCUITRY

CROSS REFERENCE TO RELATED APPLICATIONS

This application is a continuation of, and claims priority under 35 U.S.C. §120 from, nonprovisional U.S. patent application Ser. No. 15/008,358 entitled "Monolithic LED Chip in an Integrated Control Module with Active Circuitry," filed on Jan. 27, 2016, now U.S. Pat. No. 9,392,666. Application Ser. No. 15/008,358, in turn, is a continuation of, and claims priority under 35 U.S.C. §120 from, nonprovisional U.S. patent application Ser. No. 14/318,383 entitled "Monolithic LED Chip in an Integrated Control Module with Active Circuitry," filed on Jun. 27, 2014, now U.S. Pat. No. 9,277,618. The subject matter of each of the foregoing documents is incorporated herein by reference.

TECHNICAL FIELD

The present invention relates generally to packaging of light-emitting diodes.

BACKGROUND INFORMATION

A light emitting diode (LED) is a solid state device that converts electrical energy to light. Light is emitted from active layers of semiconductor material sandwiched between oppositely doped layers when a voltage is applied across the doped layers. In order to use an LED chip, the chip is typically enclosed along with other LED chips in a package. In one example, the packaged device is referred to as an LED array. The LED array includes an array of LED chips mounted onto a heat conducting substrate. A layer of silicone in which phosphor particles are embedded is typically disposed over the LED chips. Electrical contact pads are provided for supplying current into the LED array and through the LED chips so that the LED chips can be made to emit light. Light emitted from the LED chips is absorbed by the phosphor particles, and is re-emitted by the phosphor particles so that the re-emitted light has a wider band of wavelengths. Making a light fixture or a "luminaire" out of such an LED array, however, typically involves other components. The LED array generates heat when used. If the temperature of the LED array is allowed to increase excessively, performance of the LED array may suffer and the LED array may actually fail. In order to remove enough heat from the LED array so as to keep the LED array adequately cool, the LED array is typically fixed in some way to a heat sink. In addition, power must be supplied to the LED array. Power supply circuitry is typically required to supply current to the LED array in a desired and suitable fashion. Optical components are also generally employed to direct and focus the emitted light in a desired fashion. There are many considerations involved in packaging an LED array so that the array can be used effectively in an overall luminaire. Improved ways of packaging LED arrays for use in luminaries are sought.

SUMMARY

A lighting device includes a monolithic LED chip flip-chip mounted onto an interconnect structure. The monolithic chip includes first and second LED PN junctions that are formed from a single LED junction. An active electronic component is also mounted onto the interconnect structure in the proximity of the monolithic chip at a distance from the chip that is less than five times the maximum dimension of the chip. A molded plastic encapsulant forms the upper surface of the lighting device and contacts and covers the active electronic component. The active electronic component controls the LED drive currents independently supplied to the first and second LED junctions. None of the LED junctions of the monolithic LED chip is coupled to any other LED junction using wire bonds.

A first type of phosphor particles is disposed laterally above the first LED junction, and a second type of phosphor particles is disposed laterally above the second LED junction. The phosphor particles are suspended in a layer of silicone that covers the monolithic chip. A color sensor also mounted onto the interconnect structure measures the light emitted from the lighting device when the LED drive currents are supplied to the first and second LED junctions. The active electronic component then supplies more LED drive current to the first LED junction than to the second LED junction in response to the color sensor measuring the light emitted when the prior LED drive currents are supplied to the first and second LED junctions. The light emitted from the lighting device has a first color temperature when the prior LED drive currents are supplied to the first and second LED junctions and a second color temperature when the LED drive current supplied to the first LED junction is increased.

Metallic vias pass through the interconnect structure from its upper surface to its lower surface. The metallic vias are disposed laterally beneath the monolithic LED chip. No electric current flows through the metallic vias. The vias are filled with solid metal and conduct heat generated by the monolithic LED chip to a heat sink attached to the lower surface of the interconnect structure. A thermal insulator is deposited as a layer over the lower surface of the interconnect structure laterally outside the footprint of the monolithic LED chip. The thermal insulator impedes heat that is generated by the LED junctions and that flows through the metallic vias and into the heat sink from flowing back up through the lower surface of the interconnect structure and into the active electronic components.

A method involves emitting light from one of the LED junctions of the monolithic LED chip while determining the temperature of the chip using another of the LED junctions. Each of the LED junctions has a gallium nitride (GaN) layer and exhibits a band gap that exceeds two electron volts. Both of the LED junctions are formed from a single LED junction. The first LED junction is illuminated by supplying an LED drive current to the first LED junction. The temperature of the second LED junction is determined by determining a voltage across the second LED junction. The active electronic component supplies the second LED junction with a constant current and concurrently determines the voltage across the second LED junction. The active electronic component determines the temperature of the second LED junction based on the voltage across the second LED junction.

Further details and embodiments and techniques are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

DETAILED DESCRIPTION

Reference will now be made in detail to examples and some embodiments of the invention, examples of which are illustrated in the accompanying drawings.

Figure 1:
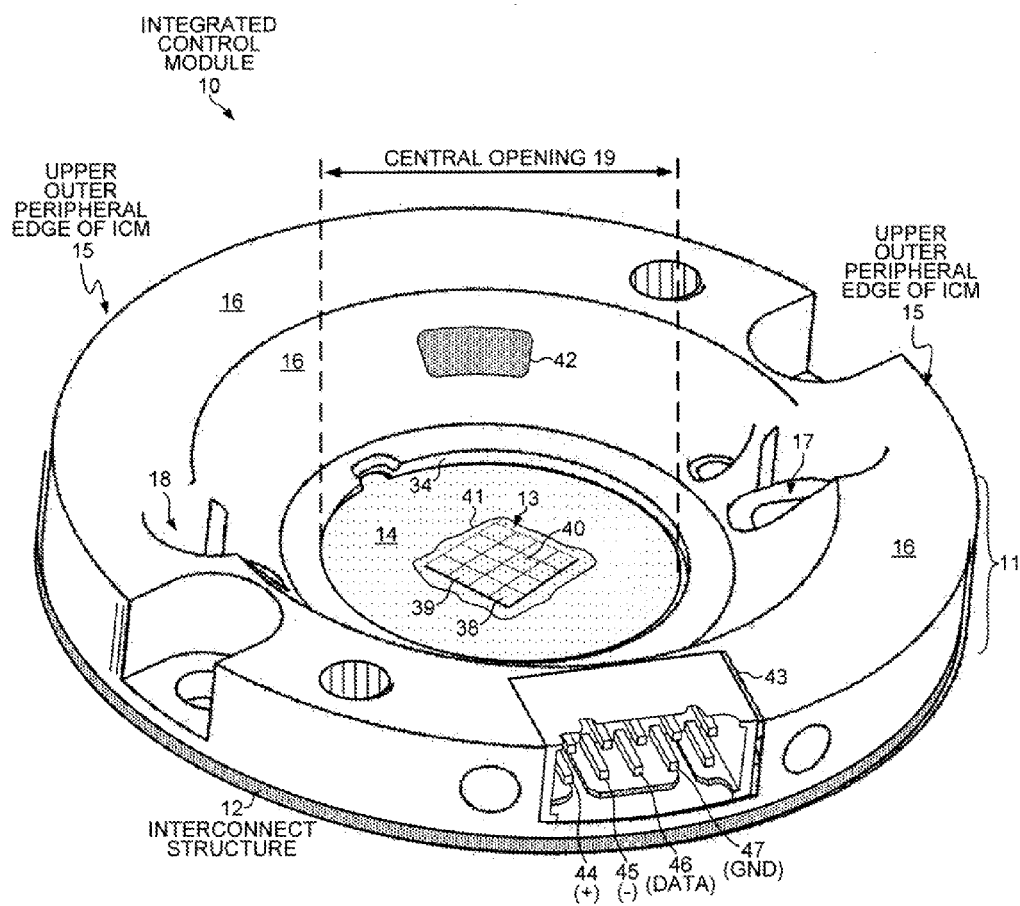
FIG. 1 is a perspective view of an integrated control module (ICM) with a monolithic LED chip.

FIG. 1 is a top perspective view of an integrated control module ("ICM") 10. ICM 10 is a disk-shaped structure that includes a plastic encapsulant 11 molded over an interconnect structure 12 upon which a monolithic light emitting diode (LED) chip 13 is mounted. The integrated control module 10 allows active electronic components to be embedded in the plastic encapsulant 11 in close proximity to the LED chip 13. The active electronic components monitor, control and provide power to the LED chip 13. Thus, integrated control module 10 is a compact, low-cost, intelligent LED package that can be incorporated into a luminaire using minimal external components.

ICM 10 has a circular upper outer peripheral edge 15 that circumscribes a toroidal upper surface 16 formed by plastic encapsulant 11. Two holes 17 and 18 are provided through which threaded screws or bolts can extend to attach ICM 10 to a heat sink. A portion of the upper surface 14 of interconnect structure 12 is visible through a circular central opening 19 in ICM 10. In this embodiment, interconnect structure 12 is a multi-layer printed circuit board (PCB). For example, interconnect structure 12 is an FR-4 printed circuit board with several metal layers made of woven fiberglass fabric with an epoxy resin binder. In other embodiments, structures such as Kapton "flex circuit" or metal clad PCB circuits can also be used for the interconnect structure. When the LED PN junctions of monolithic LED chip 13 are powered and emitting light, the light passes upward through the central circular opening 19 in upper surface 16 and is transmitted upward and away from ICM 10.

Figure 2:
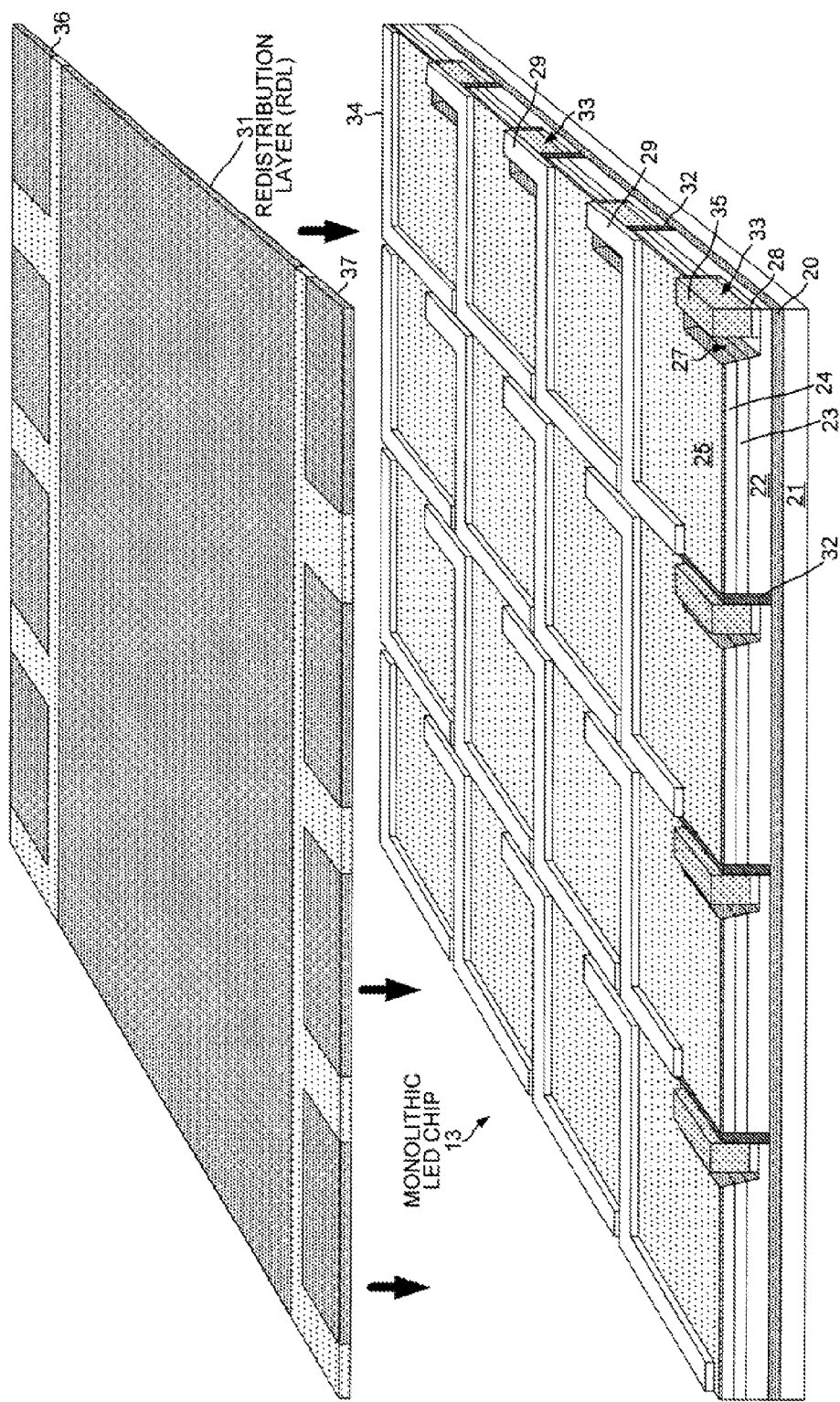
FIG. 2 is a more detailed view of the monolithic LED chip of FIG. 1.

FIG. 2 shows monolithic LED chip 13 in more detail. Monolithic LED chip 13 is flip-chip mounted onto interconnect structure 12. FIG. 2 shows chip 13 before it is inverted for flip-chip mounting. Monolithic LED chip 13 has multiple LED PN junctions all formed from the same single LED PN junction. Each of the LED junctions includes a portion of the common epitaxial layers of GaN or GaInN that were grown on a sapphire substrate. In other embodiments, the gallium-nitride layers are grown on a substrate of crystalline silicon.

Figure 3:
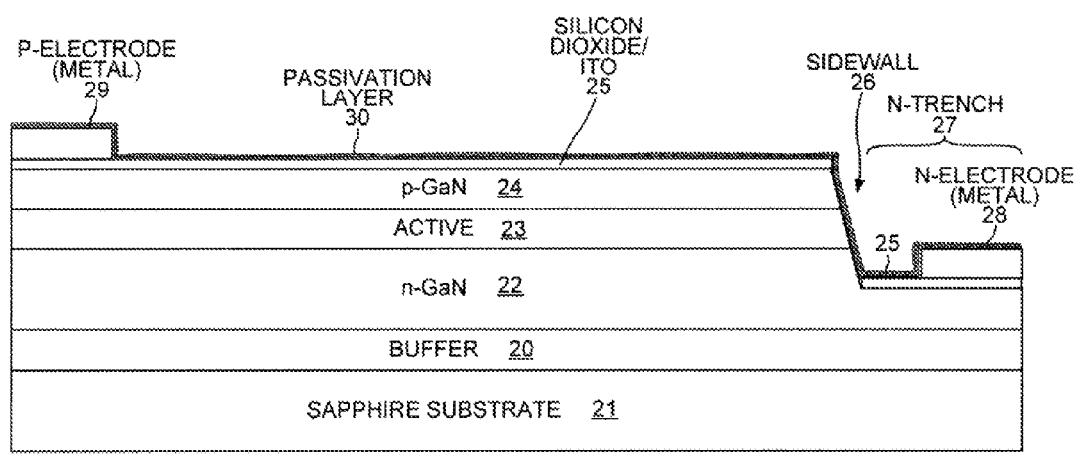
FIG. 3 is a cross sectional view illustrating the general structure of the layers of the monolithic LED chip of FIG. 1.

Monolithic LED chip 13 is made in a similar manner as are LED chips of conventional LED arrays except that chip 13 is not diced. FIG. 3 illustrates the general structure of the layers of monolithic LED chip 13. A buffer layer 20 is disposed on a sapphire substrate 21. An n-type gallium nitride (n-GaN) layer 22 is disposed over the buffer layer 20; an active layer 23 is disposed over the n-GaN layer 22; and a p-GaN layer 24 is disposed over the active layer 23. A top layer 25 of silicon dioxide over a mesh of indium tin oxide (ITO) is disposed over p-GaN layer 24. Other intervening layers of the multi-layer epitaxial structure are not shown in the simplified illustration of FIG. 3.

Reference numeral 26 identifies a sidewall formed by an N-trench 27. A metal N-electrode 28 is disposed at the bottom of N-trench 27 at the right of the diagram, whereas a metal P-electrode 29 is disposed at the left of the diagram on top of the silicon dioxide layer 25. The P-type electrode 29 makes electrical contact to the ITO mesh beneath it through many small holes that extend through the silicon dioxide of layer 25. The metal of the P-electrode 29 extends down into these holes in the silicon dioxide and makes contact with the top of the ITO. Similarly, N-type electrode 28 at the right of the diagram makes electrical contact to the underlying n-GaN layer 22 through many holes in the silicon dioxide. A passivation layer 30 covers the entire structure of the cross-sectional view of FIG. 3. Although the passivation layer 30 covers the entire portion of the structure illustrated in the cross-section of FIG. 3, there are openings in the passivation layer 30 over the electrodes where contact is made to the chip pad redistribution layer (RDL) 31 above.

Returning to FIG. 2, the LED chip structure of FIG. 3 is built up over the entire monolithic LED chip 13 of FIG. 2. Monolithic LED chip 13 is shown in FIG. 2 without passivation layer 30 and with the redistribution layer 31 elevated above the rest of the chip. The single LED PN junction of the chip is separated into the individual LED PN junctions using etching, photolithography, deposition or ion implantation. Chip 13 has been separated into sixteen separate LED junctions. All of the LED junctions of the monolithic LED chip 13 share at least one common crystalline layer. FIG. 2 shows that all of the LED junctions share sapphire substrate 21 and buffer layer 20. The individual LED junctions are made by etching down into the p-GaN 24, active 23 and n-GaN 22 layers to separate the junctions. An insulator 32 is then deposited into the channels that separate the individual LED junctions.

Various of the LED junctions are electrically connected into strings of serially connected LED junctions. The metal N-electrode 28 of one LED junction is built up with a conductive pedestal 33 which is electrically coupled to the metal P-electrode 29 of the next LED junction in the string. The P-electrode 29 extends across two sides of the top of the LED junction in order to spread the LED drive current better over the p-GaN layer 24 below. The first P-electrode 29 and the last N-electrode 28 of each string, such as P-electrode 34 and the last N-electrode 35 in FIG. 2, are then coupled to chip pads 36-37 in the redistribution layer 31 above. The sixteen LED junctions of FIG. 2 are arranged in four strings of four LED junctions each. Monolithic LED chip 13 is then flip-chip mounted onto upper surface 14 of interconnect structure 12 such that the light emitted from the LED junctions exits through the transparent sapphire substrate 21.

Returning to FIG. 1, the embodiment of LED chip 13 in FIG. 1 also has sixteen LED junctions arranged in a four-by-four matrix. The sapphire substrate 21 is facing up in FIG. 1. One of the strings, however, includes only three LED junctions. FIG. 1 shows a first string of four serially connected LED junctions 38 and a second string of four serially connected LED junctions 39. An electrical current applied to a first LED junction of each string spreads to all the LED junctions of the string. No LED junction of monolithic LED chip 13 is coupled to any other LED junction using wire bonds. In addition, no LED junction is electrically connected to interconnect structure 12 using wire bonds. A chip pad at each end of the strings is flip-chip connected to a landing pad on the upper surface of interconnect structure 12.

One of the LED junctions 40 is not serially connected to any other LED junction but rather is connected directly to terminals on interconnect structure 12. LED junction 40 may be connected either to terminals directly beneath it or through landing pads on interconnect structure 12 at the periphery of monolithic LED chip 13. The remaining three LED junctions in the row with junction 40 are serially connected to one another and form a string of three LED junctions. Drive current is not passed through sensor LED junction 40, and LED junction 40 is not connected to power supply terminals or other driver circuitry. Instead, LED junction 40 is connected to electronic components that supply LED junction 40 with a constant current and that determine the voltage across LED junction 40. At a constant current flowing through LED junction 40, the voltage across LED junction 40 depends on the temperature of LED junction 40. LED junction 40 is thereby used to determine the temperature of monolithic LED chip 13. As LED junction 40 is structurally identical to the other LED junctions and includes at least one common crystalline layer, the temperature of LED junction 40 is nearly identical to the temperatures of the other LED junctions of monolithic LED chip 13. The temperature of all of the LED junctions does not vary by more than a couple of degrees.

The voltage across gallium-nitride LED junction 40 while a constant current is flowing varies linearly with its temperature. The voltage across LED junction 40 decreases as the temperature increases while the constant current is flowing. For example, the control circuitry can determine that the temperature of LED junction 40 is about 105° C. if the voltage across LED junction 40 is 2.45 volts while a constant current of 5 mA is flowing through LED junction 40. The voltage across a diode through which a constant current is flowing varies with temperature according to the relationship $V=C-T/B$, where C is indicative of the constant current, and B is indicative of the band gap energy of the diode. For a constant current of 5 mA, C equals 2.5873. For a gallium-nitride LED junction that emits light at 452 nanometers, B equals 769.231. Thus, the temperature-voltage relationship can be expressed as $V=2.5873-T/769.231$. Using the voltage V across sensor LED junction 40 as an input, the control circuitry of ICM 10 calculates the temperature of LED chip 13 using the formula $T=769.231\times(2.5873-V)$ for a constant current of 5 mA flowing through LED junction 40. The calibration factor C must be adjusted when a different constant bias current is used.

Whereas silicon diodes with a band gap energy of about 1.1 eV would absorb almost 100% of the light emitted by the LED junctions, gallium-nitride LED junction 40 has a band gap energy of 2.7-2.8 eV and absorbs only a fraction of 1% of the light that strikes it within ICM 10. The low light absorption of gallium-nitride junction compared to silicon allows junction 40 to be used to sense temperature within chip 13 without decreasing the lumen output of ICM 10. Because a silicon diode would absorb almost 100% of the generated light that strikes it, such a diode would have to be covered by a reflective material to prevent absorption. Sapphire substrate 21, however, is substantially transparent to white light. Placing a gallium-nitride LED junction under the flip-chip oriented sapphire substrate 21 and using the junction to sense temperature will not create a dark spot on monolithic LED chip 13.

The gallium-nitride LED junctions of monolithic LED chip 13 emit blue light with a wavelength of about 452 nanometers when a sufficient drive current is passed through the junctions. The array of sixteen LED junctions is covered by a transparent carrier material 41, such as a layer of silicone or epoxy. Particles of phosphor are suspended in transparent carrier material 41. The phosphor converts a portion of the blue light generated by the LED junctions into light in the yellow region of the optical spectrum. The combination of the blue and yellow light is perceived as "white" light by a human observer. A thick slurry of phosphor suspended in silicone is dispensed over each of the LED junctions. In one embodiment, different types of phosphor particles are disposed laterally above different LED junctions. Carrier material 41 containing various combinations of phosphor particles is dispensed from a micro-pipette above each LED junction. For example, a first type of phosphor particles is disposed laterally above first string of LED junctions 38, and a second type of phosphor particles is disposed laterally above second string of LED junctions 39.

One of the electronic components embedded in plastic encapsulant 11 is a color sensor 42, which is shown in FIG. 1 on a slanted portion of upper surface 16 of ICM 10. The color temperature of the "white" light emitted by the LED junctions and from the phosphor particles is determined using color sensor 42 and other control circuitry of ICM 10. The color temperature of the light emitted by ICM 10 can be changed by supplying more LED drive current to a first string of LED junctions and less LED drive current to a second string of LED junctions such that more blue light is converted into longer wavelength light by the type of phosphor particles above the first string of LED junctions. For example, a first type of phosphor particles disposed laterally above first string of LED junctions 38 may convert blue light into a longer reddish light, while a second type of phosphor particles disposed laterally above second string of LED junctions 39 may convert blue light into a relatively shorter yellowish light. In one embodiment, the first type of phosphor particles are a mixture of yttrium aluminum garnet (YAG) and a nitride phosphor, and the second type of phosphor is just YAG. At the initial LED drive currents flowing through first string 38 and second string 39, the sensed light emitted from the first and second strings 38-41 has a first color temperature. When the LED drive current supplied to the first string 38 is increased, the light emitted from the first and second strings 38-41 has a second color temperature which is more reddish because more blue light is being emitted from below the first type of phosphor particles. In one implementation, color sensor 42 is the digital color sensor S11012-01CR from Hamamatsu Photonics, which has an RGB monolithic CMOS photo integrated circuit.

ICM 10 further includes a header socket 43 and four header pins 44-47. Pin 44 is a power terminal through which a supply voltage or a supply current is received into ICM 10. Pin 45 is a power terminal through which the current returns and passes out of ICM 10. Pin 45 is a ground terminal with respect to the power terminal 44. Pin 46 is a data signal terminal through which digital signals are communicated into and/or out of ICM 10. Pin 47 is a signal ground for the data signals communicated on pin 46. The illustrated example of a module with only four header pins 44-47 is but one example. In other examples, additional header pins are provided in the header socket 43.

Figure 4:
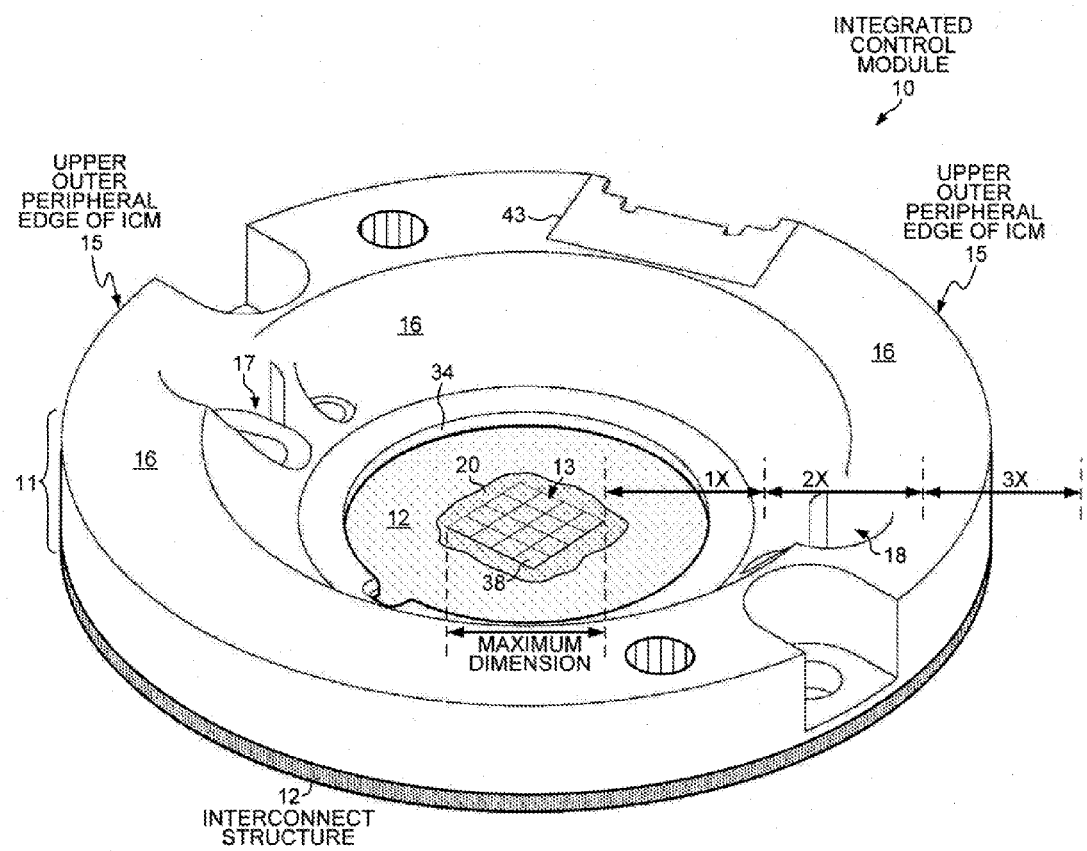
FIG. 4 is a top perspective view of the ICM of FIG. 1 from the opposite side.

FIG. 4 is a perspective view of the top of ICM 10 from the other side of the module opposite header socket 43. FIG. 4 illustrates how compact ICM 10 can be made. All of the power and control circuitry can be accommodated within the molded plastic encapsulant 11 in close proximity to the LED junctions of monolithic LED chip 13. For example, an active electronic component that controls the LED drive current supplied to LED junction 38 can be mounted onto interconnect structure 12 at a distance from monolithic chip 13 that is less than five times the maximum dimension of the combined LED junctions of monolithic chip 13. Monolithic chip 13 is a square that is 1 mm-10 mm on a side. Monolithic LED chip 13 permits a smaller form factor than an LED array that emits an equivalent amount of light. ICM 10 provides a correspondingly small but yet functional LED package that can take advantage of the smaller size of the monolithic LED light source.

Figure 5:
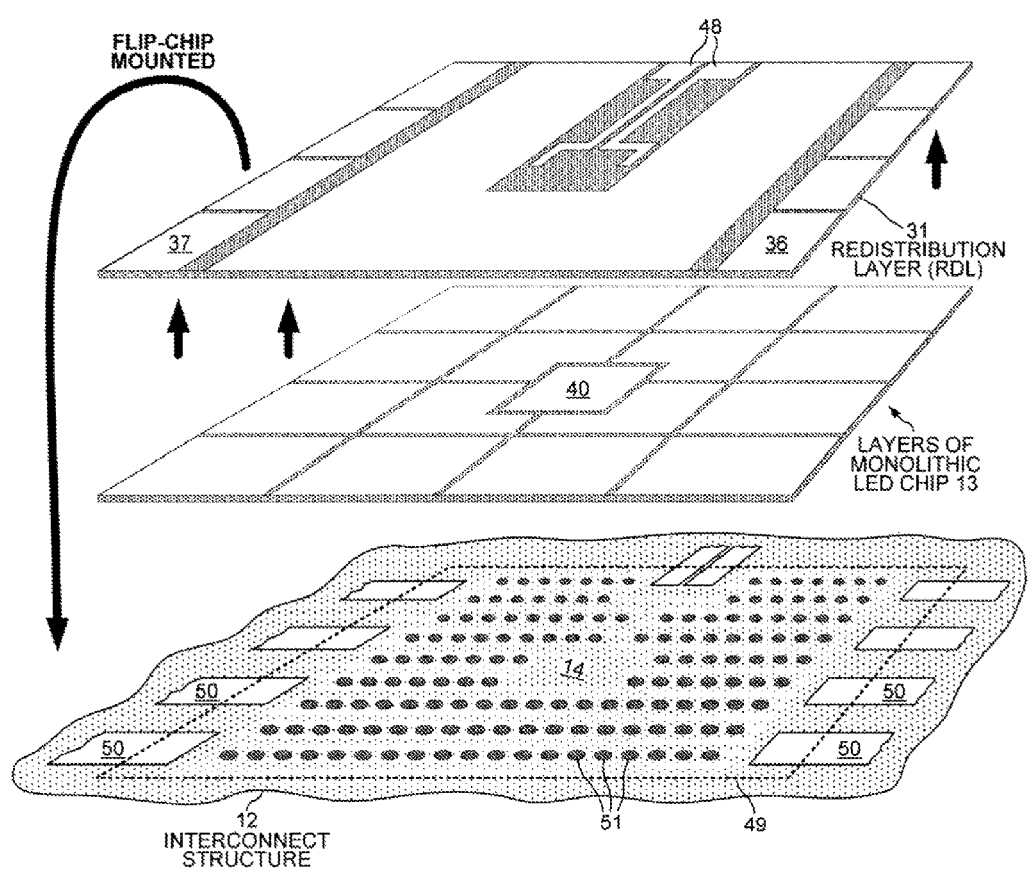
FIG. 5 is an expanded perspective view of the monolithic LED chip, a redistribution layer of the LED chip and the upper surface of an interconnect structure upon which the LED chip is to be flip-chip mounted.

FIG. 5 shows an alternative layout of the LED junctions of monolithic LED chip 13. The embodiment of FIG. 5 has seventeen LED junctions arranged in a four-by-four matrix with an additional central junction area defined for sensor LED junction 40. Redistribution layer 31 connects four horizontal strings of four LED junctions each. In addition, conductor strips 48 couple the P and N electrodes of sensor LED junction 40 to terminals at the periphery of chip 13. Monolithic LED chip 13 together with its redistribution layer 31 is then flipped over and mounted onto upper surface 14 of interconnect structure 12. Dashed line 49 shows the periphery of the mounted chip 13. Chip pads 36-37 on chip 13 then contact conductive traces 50 on upper surface 14 of interconnect structure 12 and electrically couple chip 13 to power and control circuitry on ICM 10. Metallic vias 51 are disposed laterally beneath monolithic LED chip 13 except beneath sensor LED junction 40. The vias 51 are thermally coupled to a central thermal pad on redistribution layer 31.

Figure 6:
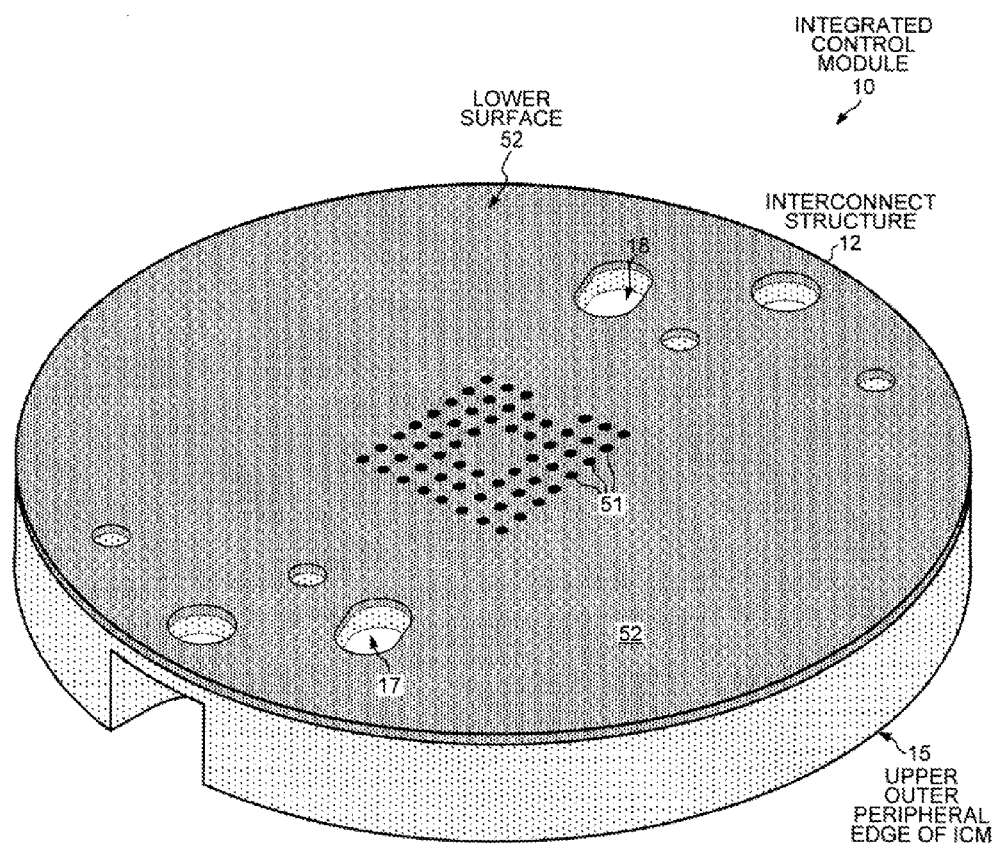
FIG. 6 is a perspective view of the bottom of the ICM of FIG. 1.

FIG. 6 is a perspective view of the bottom of ICM 10. The lower surface 52 of interconnect structure 12 forms the bottom surface of ICM 10. FIG. 6 shows the plurality of metallic vias 51 that pass through interconnect structure 12 from upper surface 14 through to lower surface 52. The metallic vias 51 are disposed laterally beneath monolithic LED chip 13 when ICM 10 is oriented upright as shown in FIG. 1. Vias 51 are filled with solid metal and conduct heat generated by monolithic LED chip 13 to a heat sink (not shown) attached to lower surface 52 of interconnect structure 12. For example, the vias 51 are made of copper. No electric current flows through the metallic vias 51.

Figure 7:
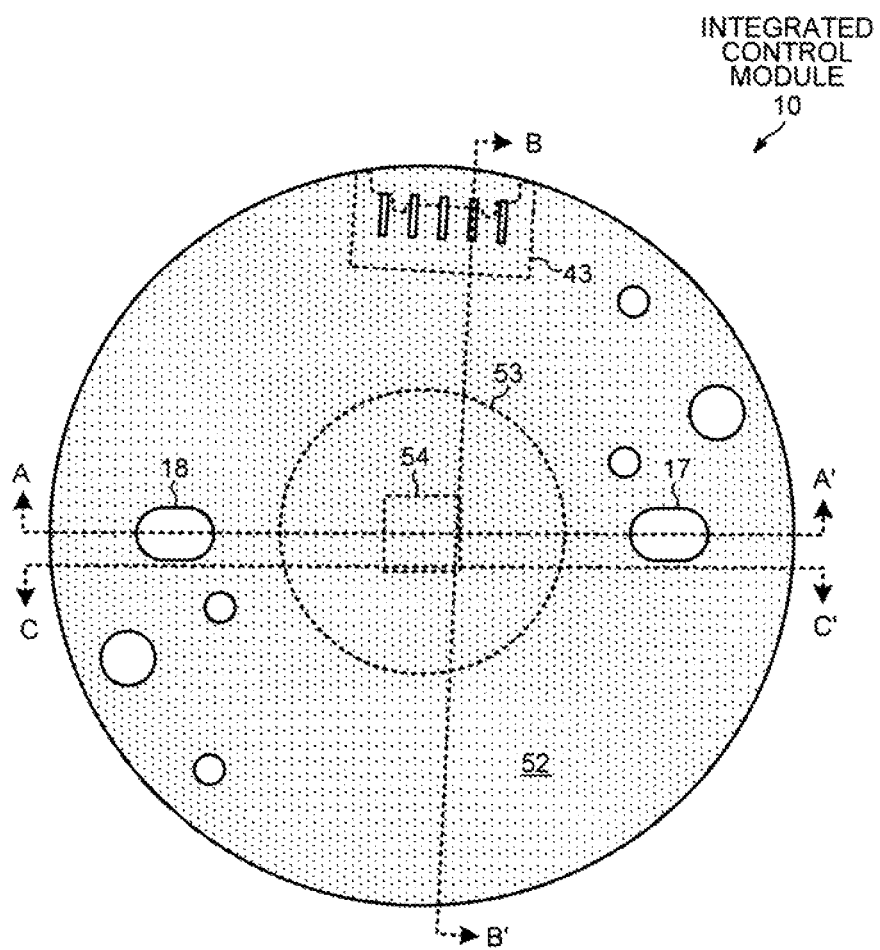
FIG. 7 is a cross-sectional view of the bottom of the ICM of FIG. 1.

FIG. 7 shows the bottom of ICM 10. The dashed circle 53 identifies the location on the other side of interconnect structure 12 of the circular central opening 19 in the upper surface 16 of ICM 10. The dashed square 54 identifies the location on the other side of interconnect structure 12 of monolithic LED chip 13.

Figure 8:
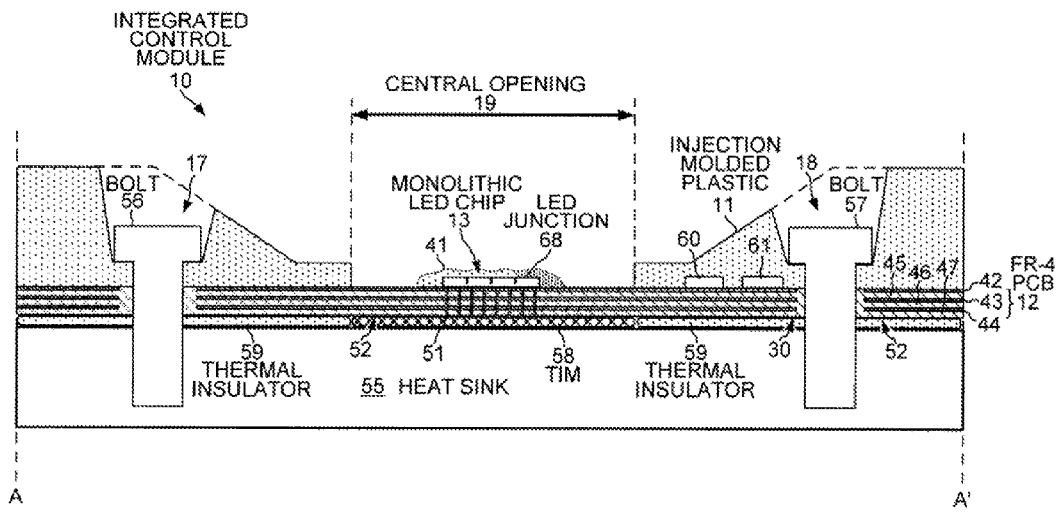
FIG. 8 is a cross-sectional view taken along line A-A' of the ICM of FIG. 1 showing the ICM being attached to a heat sink by bolts.

FIG. 8 is a cross-sectional view of ICM 10 of FIG. 7 taken along sectional line A-A' (shown on a heat sink 55). Bolts 56 and 57 extend through holes 17 and 18 and hold the lower surface 52 of interconnect structure 12 in good thermal contact with the heat sink 55 through a layer of a thermal interface material (TIM) 58. The thermal interface material 58 is deposited laterally only beneath central opening 19 and under the metallic vias 51. A thermal insulator 59 is deposited on lower surface 52 of interconnect structure 12 outside the lateral boundary of central opening 19. Before ICM 10 is mounted on heat sink 55, thermal insulator 59 is deposited as a layer over bottom surface 52 of ICM 10. Thermal insulator 59 impedes heat that is generated by the LED junctions and that flows through metallic vias 51 and thermal interface material 58 and into heat sink 55 from flowing back up through lower surface 52 of interconnect structure 12 and into the electronic components. In some embodiments, thermal insulator 59 is a ceramic or fibrous material. Reference numerals 60 and 61 identify electronic components of control circuitry mounted on interconnect structure 12. The injection molded plastic encapsulant 11 encases and encapsulates interconnect structure 12 and the electronic components. In the illustrated example, the interconnect structure 12 is a multi-layer printed circuit board (PCB), such as an FR-4 PCB. PCB 12 includes three metal layers 62-64 and three fiberglass layers 65-67.

The LED junctions of monolithic LED chip 13, such as LED junction 68, are covered by transparent carrier material 41 containing phosphor particles. In the embodiment of FIG. 8, a different type of phosphor particles is suspended in the carrier material 41 that is dispensed over LED junction 68 than the phosphor particles in the carrier material 41 over the other LED junctions. For example, by driving an LED drive current through LED junction 68, a reddish light emitted by the phosphor particles above LED junction 68 can be added to the overall mix of blue light from the other LED junctions and yellow light from the other type of phosphor particles. When a drive current is not supplied to LED junction 68, the average wavelength of the light emitted from ICM 10 is shorter.

Figure 9:
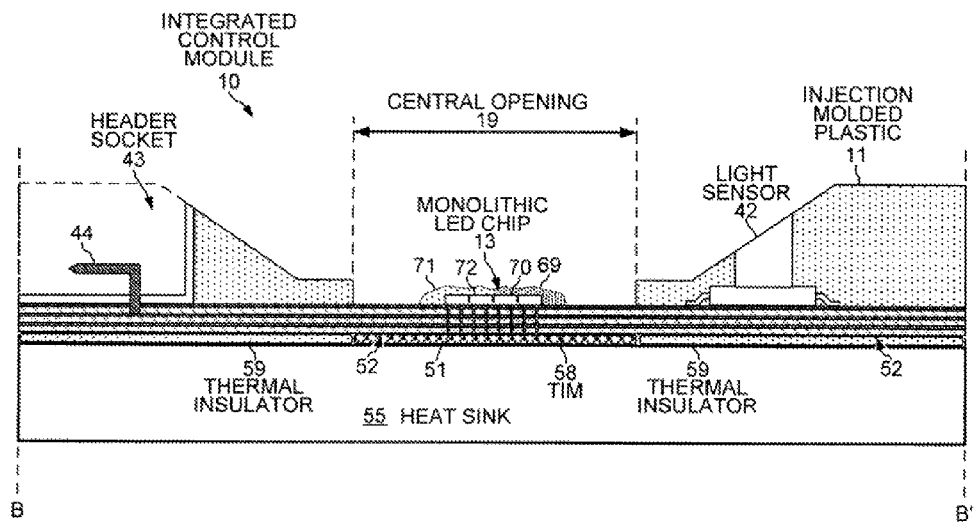
FIG. 9 is a cross-sectional view taken along line B-B' of the ICM of FIG. 1 showing a color sensor embedded in the slanted upper surface of the molded encapsulant of the ICM of FIG. 1.

FIG. 9 is a cross-sectional view of ICM 10 of FIG. 7 taken along sectional line B-B' (shown on heat sink 55). FIG. 9 shows header socket 43 and color sensor 42. Light emitted from the LED junctions and from the phosphor particles is sensed by color sensor 42, which has an intake portion in the slanted surface of upper surface 16 of ICM 10. FIG. 9 shows a first type of phosphor particles 69 suspended in silicone disposed laterally above a first LED junction 70 and a second type of phosphor particles 71 suspended in silicone disposed laterally above a second LED junction 72. Color sensor 42 senses the color temperature of the light emitted from first LED junction 70, the first type of phosphor particles 69, second LED junction 72 and the second type of phosphor particles 71. The color temperature of the overall light being emitted from ICM 10 can be changed by increasing the LED drive current supplied to first LED junction 70 such that a greater proportion of the emitted light has the wavelength generated by the first type of phosphor particles 69.

Figure 10:
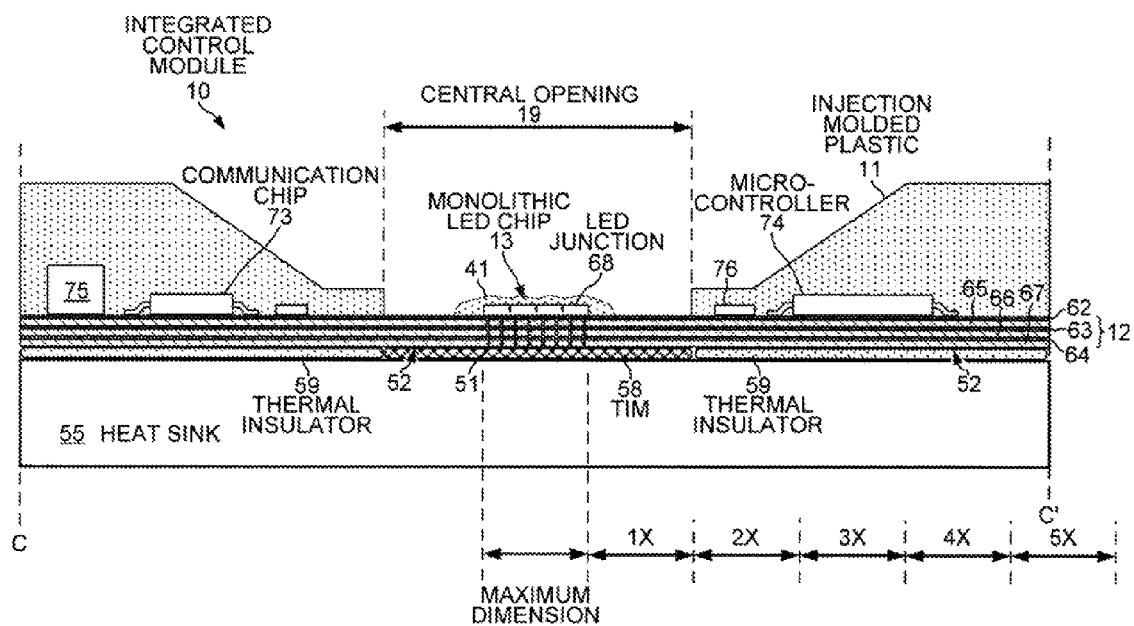
FIG. 10 is a cross-sectional view taken along line C-C' of the ICM of FIG. 1 showing electronic components mounted onto the interconnect structure within a distance from the LED chip that is less than five times the maximum dimension of the LED chip.

FIG. 10 is a cross-sectional view of ICM 10 of FIG. 7 taken along sectional line C-C' (shown on heat sink 55). Electronic components of the circuit as seen in the cross-section include a communication integrated circuit 73, a microcontroller integrated circuit 74, a FET switch 75 and a temperature interface circuit 76. Each of these active electronic components is a packaged device that is in turn overmolded by the plastic encapsulant 11 of ICM 10.

FIG. 10 also illustrates that all of the power and control circuitry can be accommodated within the molded plastic encapsulant 11 in close proximity to monolithic LED chip 13. For example, microcontroller 74 is an active electronic component that controls the LED drive current supplied to LED junction 68 and can be mounted onto interconnect structure 12 at a distance from monolithic chip 13 that is less than five times the maximum dimension of monolithic chip 13. The layout of ICM 10 permits the power and control circuitry to be located within close proximity to monolithic LED chip 13 without being overheated from the heat generated by the LED junctions. The metallic vias 51 and the thermal interface material 58 laterally beneath chip 13 conduct the heat generated by the LED junctions into heat sink 55. Thermal insulator 59 prevents the heat that flows through the metallic vias 51 and thermal interface material 58 from flowing back up through lower surface 52 of interconnect structure 12 and into the electronic components.

Figure 11:
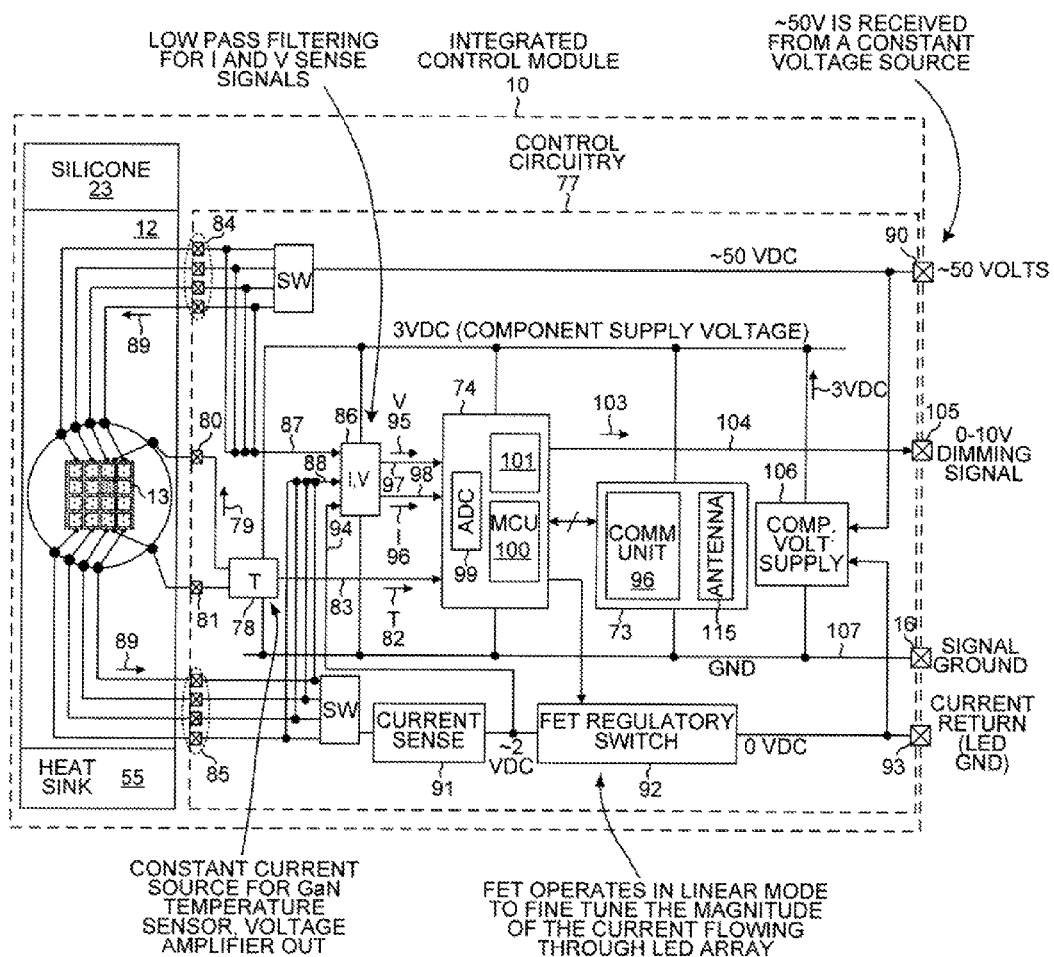
FIG. 11 is a circuit diagram showing a first implementation of the control circuitry of the ICM of FIG. 1.

FIG. 11 is a diagram of the control circuitry 77 of ICM 10 in a first novel aspect. ICM 10 is illustrated with heat sink 55 and with monolithic LED chip 13 covered by transparent carrier material 41. Microcontroller 74 monitors the temperature of LED chip 13 using a temperature interface circuit 78. Temperature interface circuit 78 includes a constant current source that supplies a constant current 79 to the temperature-sensing GaN LED junction 40 via a contact pads 80 and 81. The temperature interface circuit 78 also includes a voltage amplifier that amplifies the sensed voltage across contact pads 80 and 81 and supplies the resulting amplified voltage signal T 82 to microcontroller 74 via conductor 83. In addition, microcontroller 74 monitors the voltage V with which the LED junctions are driven. This LED drive voltage is the voltage between sets of contact pads 84 and 85. A current and voltage measuring interface circuit 86 measures this voltage via conductors 87 and 88. In addition, microcontroller 74 monitors the LED drive current 89 flowing through the LED junctions of LED chip 13. This current 89 flows from pin 90, through contact pads 84, through the LED junctions, through contact pads 85, through current sense resistor 91, through FET switch 92 and out of ICM 10 via pin 93. The current and voltage measuring interface circuit 86 detects the LED drive current 89 as the voltage dropped across the current sense resistor 91. This voltage is detected across conductors 88 and 94. The voltage and current measuring interface circuit 86 receives the voltage sense and current sense signals, low pass filters them, amplifies them, and performs level shifting and scaling to generate a voltage sense signal V 95 and a current sense signal I 96. The voltage and current sense signals 95 and 96 are supplied to microcontroller 74 via conductors 97 and 98, respectively.

The T signal 82, the V signal 95, and the I signal 96 are converted into digital values by the analog-to-digital converter (ADC) 99 of the microcontroller. A main control unit (MCU) 100 of the microcontroller executes a program 101 of processor-executable instructions. The I, V and T signals, as well as information received from communication integrated circuit 73, are used by the MCU 100 to determine how to control FET switch 92. In the present example, the MCU 100 can control the FET switch to be nonconductive, thereby turning off all LED junctions. The MCU 100 can control the FET switch to be fully conductive, thereby turning on the strings of LED junctions to a brightness proportional to the current supplied by the AC-DC converter as controlled by a zero-to-ten-volt signal produced by the MCU as directed by the control program. ICM 10 receives a substantially constant current via pins 90 and 93 from an AC-to-DC power supply circuit 102 (see FIG. 14). The AC-to-DC power supply circuit 102 has a constant current output, the magnitude of the constant current being controllable by a zero-to-ten-volt signal received by the AC-to-DC power supply circuit. The voltage that results across pins 90 and 93 when this constant current is being supplied to ICM 10 is about fifty volts. Microcontroller 74 controls the FET switch 92 to be fully on with nearly zero voltage across it when LED chip 13 is to be illuminated. To accomplish control for a desired LED brightness (desired amount of current flow through the LED junctions), microcontroller 74 sends a zero-to-ten-volt dimming control signal 103 back to the AC-to-DC power supply circuit 102 via conductor 104, and data terminal 105. Microcontroller 74 uses this control signal 103 to increase and to decrease the magnitude of the constant current 89 being output by the AC-to-DC power supply circuit 102. The circuit components 78, 86, 74 and 73 are powered from a low DC supply voltage such as three volts DC. A component voltage supply circuit 106 generates this 3-volt supply voltage from the fifty volts across pins 90 and 93. The 3-volt supply voltage is supplied onto voltage supply conductor 104. Conductor 107 is the ground reference conductor for the component supply voltage. Because only a small amount of power is required to power the circuitry embedded in ICM 10, the component voltage supply circuit 106 may be a simple linear voltage regulator.

Figure 12:
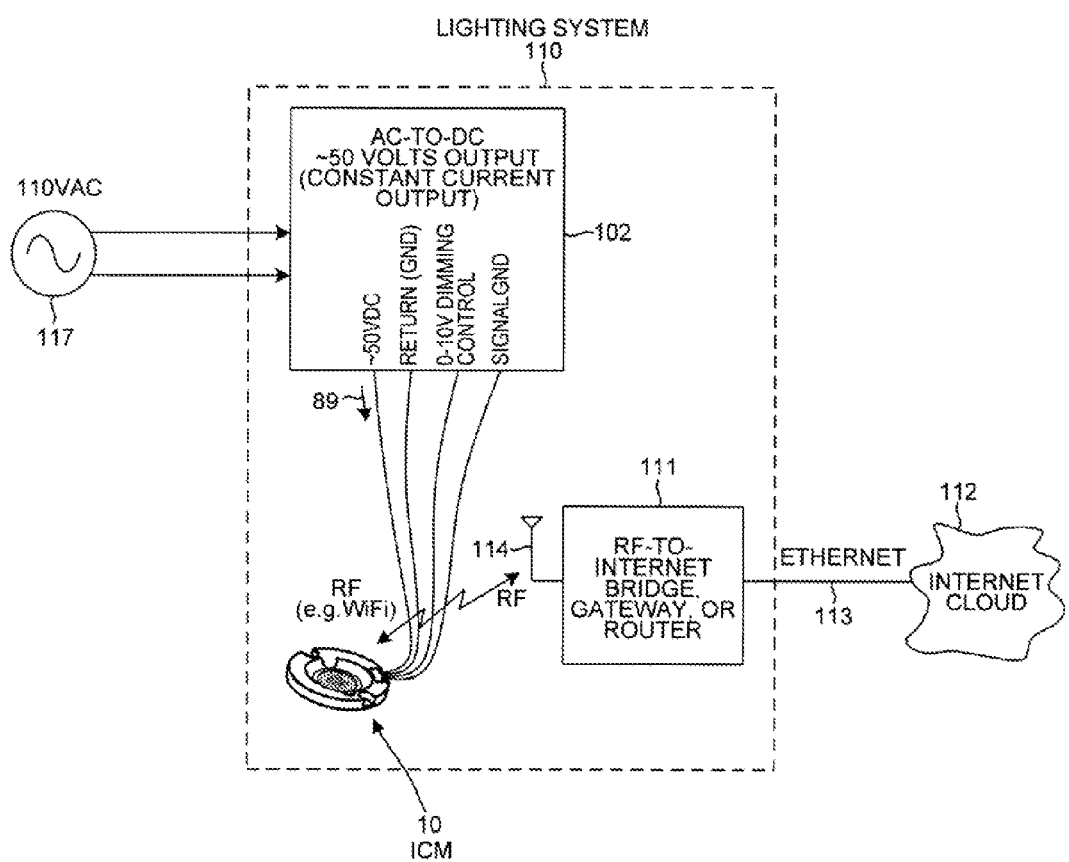
FIG. 12 is a diagram of a lighting system that includes the ICM of FIG. 11.

FIG. 12 is a system level diagram of a lighting system 110 that incorporates ICM 10, power supply circuit 102 and internet connectivity circuitry 111. The LED junctions of ICM 10 can be monitored and controlled remotely by communicating across the internet 112. Information can be communicated from the internet 112, across an ethernet connection 113, through the internet connectivity circuitry 111, from antenna 114 of the internet connectivity circuitry 111 to the antenna 115 of ICM 10 in the form of an RF transmission, through transceiver 116 of the communication integrated circuit 73, and to the MCU 100 of microcontroller 74. Information can also be communicated in the opposite direction from the MCU 100 of microcontroller 74, through the transceiver 116 of the communication integrated circuit 73, from antenna 115 in the form of an RF transmission to antenna 114, through the internet connectivity circuitry 111, across ethernet connection 113, to the internet 112. The lighting system 110 is typically part of a luminaire (light fixture) that is powered by ordinary 110 VAC wall power. Symbol 117 represents a source of 110 VAC wall power for the luminaire.

Figure 13:
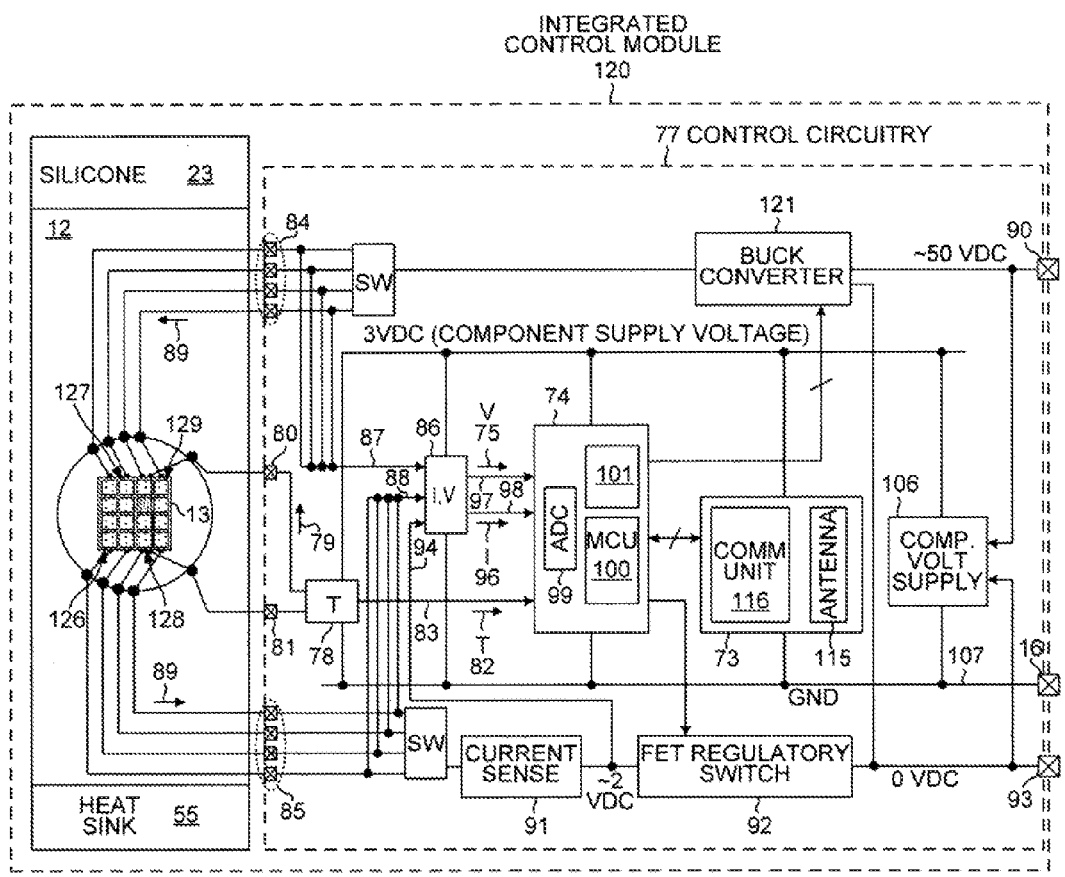
FIG. 13 is a circuit diagram showing a second implementation of the control circuitry of the ICM of FIG. 1 that includes a buck converter.

FIG. 13 is a diagram of ICM 120 in accordance with a second novel aspect. ICM 120 is similar to ICM 10 of FIG. 11 explained above, except that: 1) ICM 120 of FIG. 13 does not output a 0-10 volt dimming control signal, and 2) ICM 120 includes a switching DC-to-DC converter 121. In the example of FIG. 13, the switching DC-to-DC converter is a buck converter. In another embodiment, there is a separate buck converter for each string of LED junctions on monolithic LED chip 13.

Figure 14:
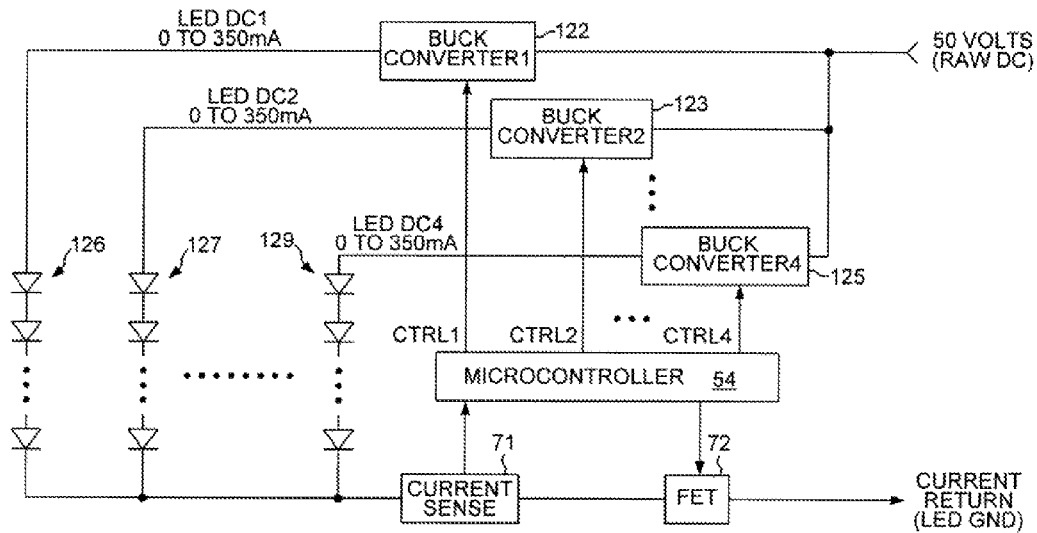
FIG. 14 is a diagram illustrating a first way to drive multiple strings of LED junctions with multiple buck converters, where the multiple buck converters are parts of the ICM of FIG. 13.

FIG. 14 is a diagram illustrating a first way to drive multiple strings of LED junctions with multiple buck converters, where the multiple buck converters are parts of ICM 10. In the example of FIG. 14, the buck converter block 121 of FIG. 13 actually includes multiple buck converters 122-125. Each of the strings 126-129 is driven independently by buck converters 122-125, respectively. Microcontroller 74 controls each of the buck converters separately by sending each buck converter different digital control information across different control lines. Microcontroller 74 controls the frequency and/or duty cycle output by each buck converter's programmable oscillator separately. Microcontroller 74 monitors current flow through each string of LED junctions one at a time using the same single current sense resistor 91. Providing multiple buck converters in this way reduces the physical size of the inductors of the buck converters. Where four strings of LED junctions are separately driven, each by a separate buck converter, the approximate physical size of the inductor of each buck converter is 2.5 mm by 2.5 mm by 1.0 mm. This small inductor size facilitates encapsulation in a slim ICM profile.

Figure 15:
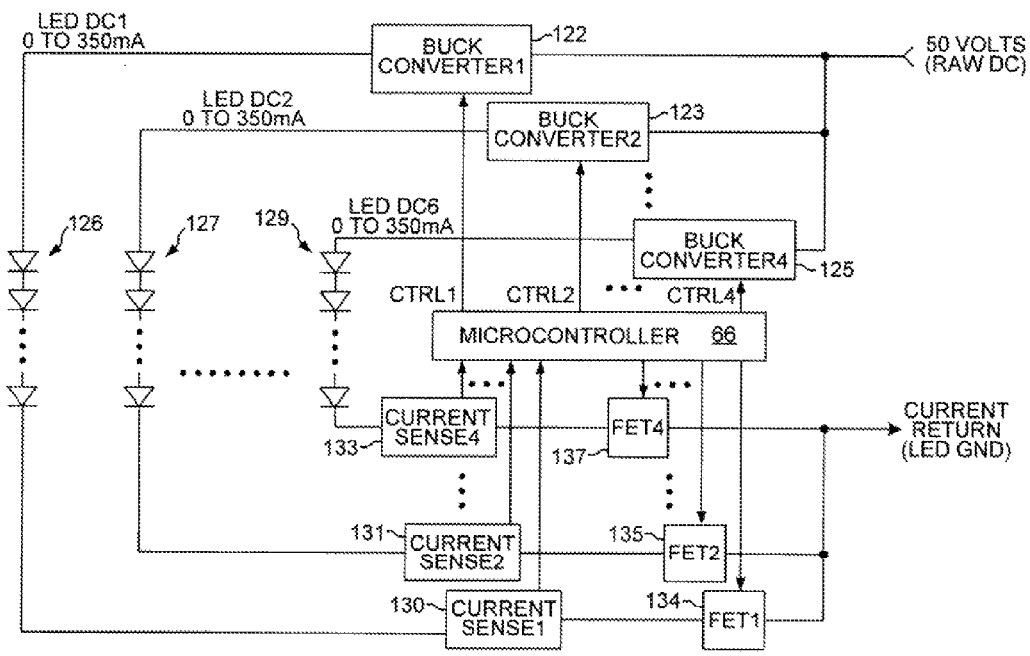
FIG. 15 is a diagram illustrating a second way to drive multiple strings of LED junctions with multiple buck converters, where the multiple buck converters are parts of the ICM of FIG. 13.

FIG. 15 is a diagram illustrating a second way to drive multiple strings of LED junctions with multiple buck converters, where the multiple buck converters are parts of ICM 10. In this case, each string of LEDs has a corresponding dedicated current sense resistor and FET switch. In the example of FIG. 15, the current sense resistor 91 of FIG. 13 actually includes multiple current sensors 130-133, and FET switch 92 of FIG. 13 actually includes multiple switches 134-137. Current sense resistor 130 and FET switch 134 are for the first string of LED junctions 126. Current sense resistor 131 and FET switch 135 are for the second string of LED junctions 127. And current sense resistor 133 and FET switch 137 are for the last string of LED junctions 129.

Figure 16:
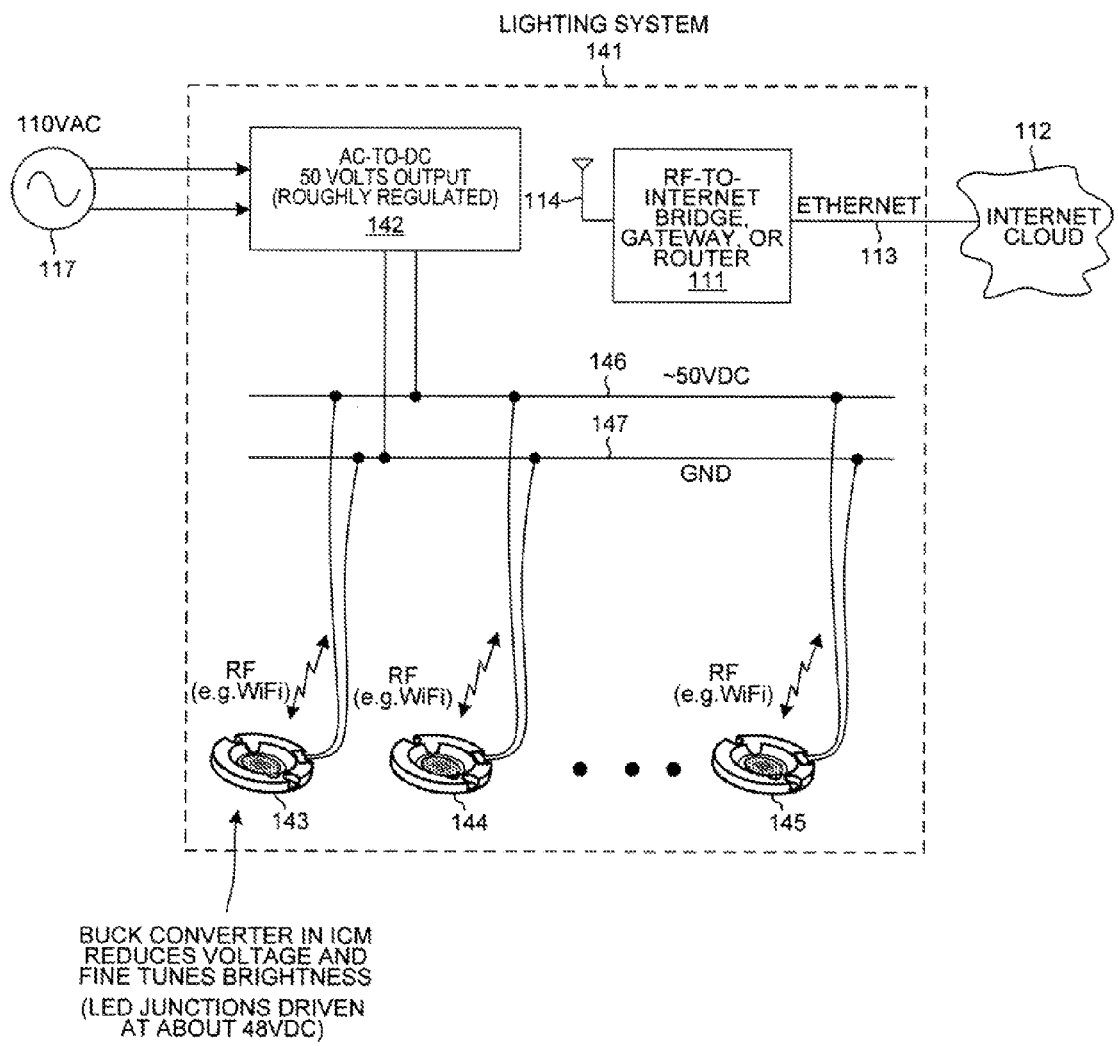
FIG. 16 is a diagram of a lighting system that includes multiple instances of the ICM of FIG. 13.

FIG. 16 is a diagram of a lighting system 141 that includes multiple instances of ICM 120 of FIG. 13. Lighting system 141 includes an AC-to-DC power supply 142, multiple integrated control modules 143-145 of the type shown in FIG. 13, and internet connectivity circuitry 111. Bidirectional communication between each ICM 120 and the internet 112 via internet connectivity circuitry 111 is the same as described above in connection with FIG. 12. However, unlike the AC-to-DC power supply 102 of the embodiment of FIG. 12 that outputs a regulated substantially constant current (the magnitude of which is adjustable), the AC-to-DC power supply 142 of the embodiment of FIG. 16 outputs a substantially constant voltage that is only roughly regulated. This roughly regulated voltage, in the example of FIG. 16, is 50 volts. This roughly regulated voltage is supplied in parallel to the many integrated control modules 143-145 via conductors 146 and 147 as shown. The control of the amount of LED drive current supplied to the LED junctions of an individual integrated control module 120 is controlled by the switching power supply (for example, a buck converter) within each ICM itself. Each of the ICMs 143-145 controls the amount of LED drive current being supplied to its own LED junctions. The AC-to-DC power supply 142 therefore can output a supply voltage that is only roughly regulated. The AC-to-DC power supply 142 need not receive any 0-10 volt control signal to control its output.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. A device comprising:
    a monolithic LED chip including a first LED junction and a second LED junction, wherein the first LED junction and the second LED junction are formed from a single LED junction;
    an active electronic component that controls an LED drive current supplied to the first LED junction, wherein the active electronic component is mounted onto an interconnect structure onto which the monolithic LED chip is mounted; and
    a molded encapsulant that forms an upper surface of the device, wherein the molded encapsulant contacts and covers the active electronic component, wherein the LED drive current supplied to the first LED junction is sufficient to illuminate the first LED junction, and wherein the active electronic component supplies the second LED junction with a constant current and determines a voltage across the second LED junction.

2. The device of claim 1, wherein the monolithic LED chip has a maximum dimension, and wherein the active electronic component is mounted onto the interconnect structure at a distance from the monolithic LED chip that is less than five times the maximum dimension.

3. The device of claim 1, wherein a front side of the monolithic LED chip is mounted onto the interconnect structure, wherein a back side of the monolithic LED chip is disposed opposite the front side, wherein the back side is covered by a layer of silicone in which phosphor particles are suspended, wherein a first type of phosphor particles is disposed laterally above the first LED junction, and wherein a second type of phosphor particles is disposed laterally above the second LED junction.

4. The device of claim 1, wherein the interconnect structure has an upper surface and a lower surface, wherein the monolithic LED chip is flip-chip mounted onto the upper surface, wherein a metallic via passes through the interconnect structure from the upper surface to the lower surface, wherein the metallic via is disposed laterally beneath the monolithic LED chip, and wherein no electric current flows through the metallic via.

5. The device of claim 1, wherein the interconnect structure has an upper surface and a lower surface, wherein no metallic via passes through the interconnect structure from the upper surface to the lower surface laterally outside the monolithic LED chip.

6. The device of claim 1, wherein the active electronic component is a microcontroller.

7. The device of claim 1, wherein the active electronic component is an AC-to-DC converter.

8. A device comprising:
    a monolithic LED chip including a first LED junction and a second LED junction, wherein the first LED junction and the second LED junction are formed from a single LED junction;
    an active electronic component that controls an LED drive current supplied to the first LED junction; and
    a color sensor that measures light emitted when the LED drive current is supplied to the first LED junction, wherein the active electronic component increases the LED drive current supplied to the first LED junction compared to that supplied to the second LED junction in response to the color sensor measuring the light emitted when the LED drive current is supplied to the first LED junction, wherein the monolithic LED chip has a maximum dimension, and wherein the active electronic component is mounted onto an interconnect structure onto which the monolithic LED chip is mounted at a distance from the monolithic LED chip that is less than five times the maximum dimension.

9. A device comprising:
a monolithic LED chip including a first LED junction and a second LED junction, wherein the first LED junction and the second LED junction are formed from a single LED junction;
an active electronic component that controls an LED drive current supplied to the first LED junction;
a color sensor that measures light emitted when the LED drive current is supplied to the first LED junction, wherein the active electronic component increases the LED drive current supplied to the first LED junction compared to that supplied to the second LED junction in response to the color sensor measuring the light emitted when the LED drive current is supplied to the first LED junction;
a first type of phosphor particles disposed laterally above the first LED junction; and
a second type of phosphor particles disposed laterally above the second LED junction, wherein the first type of phosphor particles and the second type of phosphor particles are suspended in a layer of silicone that covers the monolithic LED chip.

10. The device of claim 9, wherein the light emitted from the first LED junction, the second LED junction, the first type of phosphor particles and the second type of phosphor particles has a first color temperature, and wherein the light emitted from the first LED junction, the second LED junction, the first type of phosphor particles and the second type of phosphor particles has a second color temperature when the LED drive current supplied to the first LED junction is increased.

11. A device comprising:
a monolithic LED chip including a first LED junction and a second LED junction, wherein the first LED junction and the second LED junction are formed from a single LED junction;
an interconnect structure, wherein the monolithic LED chip is flip-chip mounted onto the interconnect structure, and wherein no LED junction of the monolithic LED chip is coupled to any other LED junction using a wire bond; and
an active electronic component that controls an LED drive current supplied to the first LED junction, wherein the LED drive current supplied to the first LED junction is sufficient to illuminate the first LED junction, and wherein the active electronic component supplies the second LED junction with a constant current and determines a voltage across the second LED junction.

12. The device of claim 11, wherein the active electronic component determines a temperature of the second LED junction based on the voltage across the second LED junction.

13. The device of claim 11, wherein the LED drive current has a maximum magnitude, and wherein the constant current has a maximum magnitude that never exceeds the maximum magnitude of the LED drive current.

14. The device of claim 11, wherein the second LED junction has a band gap that exceeds two electron volts.

15. A device comprising:
a monolithic LED chip including a first LED junction and a second LED junction, wherein the first LED junction and the second LED junction are formed from a single LED junction;
an interconnect structure, wherein the monolithic LED chip is flip-chip mounted onto an upper surface of the interconnect structure, wherein a metallic via passes through the interconnect structure from the upper surface to a lower surface of the interconnect structure, wherein the metallic via is disposed laterally beneath the monolithic LED chip, and wherein no electric current flows through the metallic via; and
an active electronic component that controls an LED drive current supplied to the first LED junction, wherein the monolithic LED chip has a maximum dimension, and wherein the active electronic component is mounted onto the upper surface of the interconnect structure at a distance from the monolithic LED chip that is less than five times the maximum dimension.

16. The device of claim 15, wherein no metallic via passes through the interconnect structure from the upper surface to the lower surface laterally outside the monolithic LED chip.

17. The device of claim 15, wherein the LED drive current supplied to the first LED junction is sufficient to illuminate the first LED junction, and wherein the active electronic component supplies the second LED junction with a constant current and determines a voltage across the second LED junction.

18. The device of claim 17, wherein the active electronic component determines a temperature of the second LED junction based on the voltage across the second LED junction.

19. The device of claim 17, wherein the constant current supplied to the second LED junction by the active electronic component has a maximum magnitude that never exceeds ten milliamps.

* * * * *